(12) United States Patent
Hatano et al.

(10) Patent No.: US 6,344,668 B1
(45) Date of Patent: Feb. 5, 2002

(54) SOLID-STATE IMAGE PICKUP DEVICE AND METHOD OF MANUFACTURING THE SAME

(75) Inventors: Keisuke Hatano; Yasutaka Nakashiba, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/299,635

(22) Filed: Apr. 27, 1999

(30) Foreign Application Priority Data

May 11, 1998 (JP) .......................................... 10-127564

(51) Int. Cl.$^7$ ...................... H01L 27/148; H01L 29/768
(52) U.S. Cl. ........................ 257/231; 257/232; 257/233
(58) Field of Search ................. 257/232, 231, 257/233

(56) References Cited

U.S. PATENT DOCUMENTS

| | | | |
|---|---|---|---|
| 5,336,919 A | 8/1994 | Toriyama | 257/435 |
| 5,581,300 A | 12/1996 | Kim | 348/297 |

FOREIGN PATENT DOCUMENTS

| | | |
|---|---|---|
| JP | 7-30088 | 1/1995 |
| JP | 7-45806 | 2/1995 |
| JP | 8-288484 | 11/1996 |

*Primary Examiner*—William Mintel
(74) *Attorney, Agent, or Firm*—Young & Thompson

(57) ABSTRACT

An image pickup element unit and peripheral circuits are formed on a common semiconductor substrate. The image pickup element unit comprises sensors which converts incident lights into charges. The peripheral circuits comprise contact holes therein and transfer signals to external components via the contact holes. A tungsten film which works as both a photo shield and a barrier metal film is formed on the semiconductor substrate so that each of the sensors has its opening portion and the contact holes are filled with the tungsten film. An aluminum film which works as wiring is formed on the tungsten film filing the contact holes. A tungsten silicide layer is formed at conjunction portion between the tungsten film in the contact holes and the semiconductor substrate. Contacts comprising the tungsten film and the tungsten silicide layer show excellent ohmic contact characteristics.

12 Claims, 8 Drawing Sheets

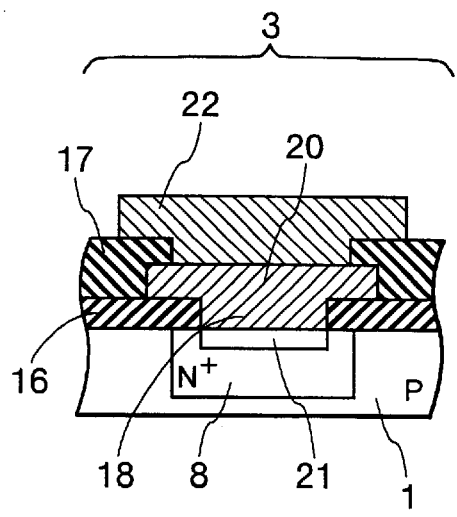
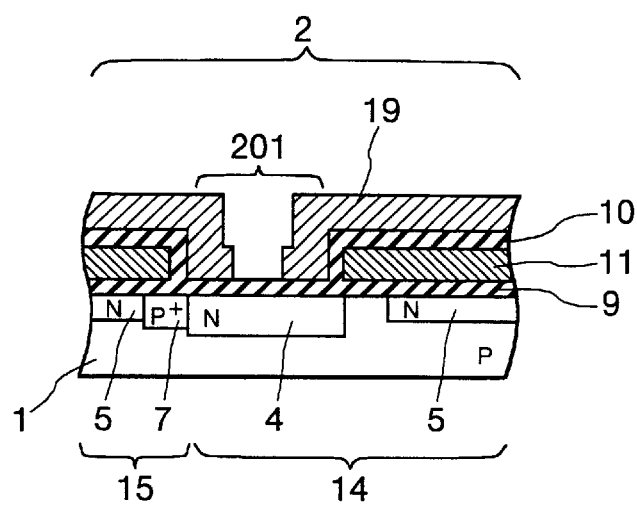
FIG. 2A  FIG. 2B
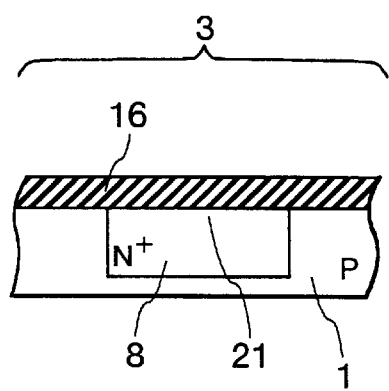
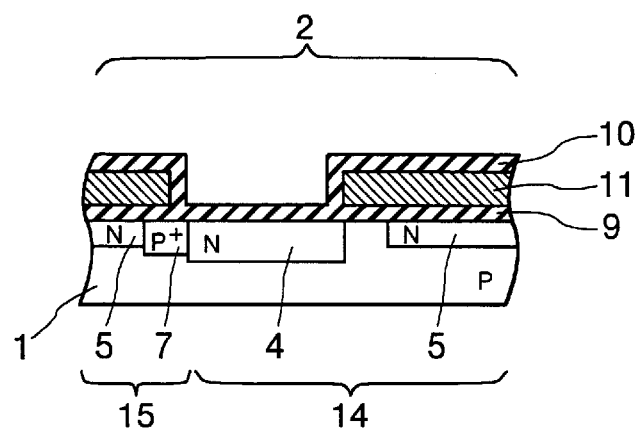
FIG. 3A  FIG. 3B

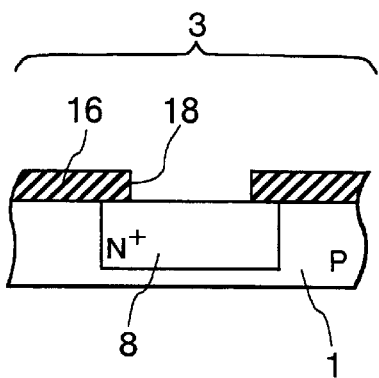
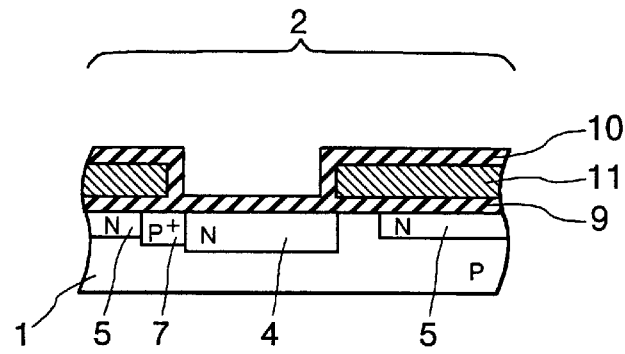
FIG. 4A  FIG. 4B
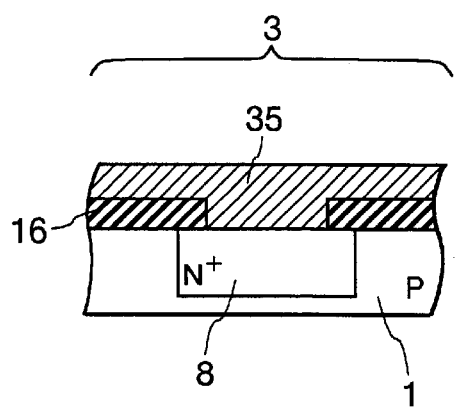
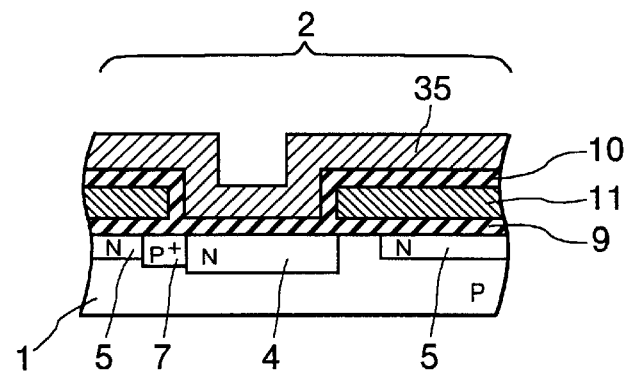
FIG. 5A  FIG. 5B

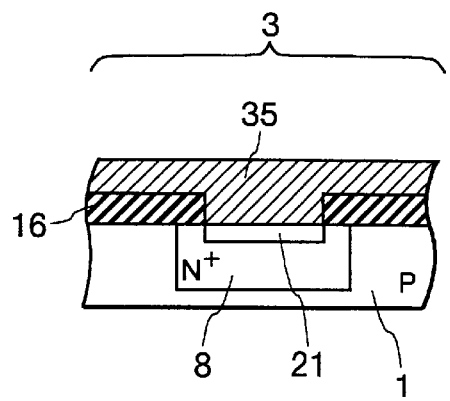
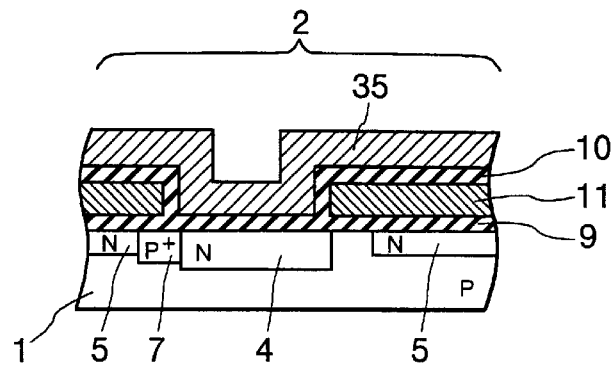
FIG. 6A  FIG. 6B
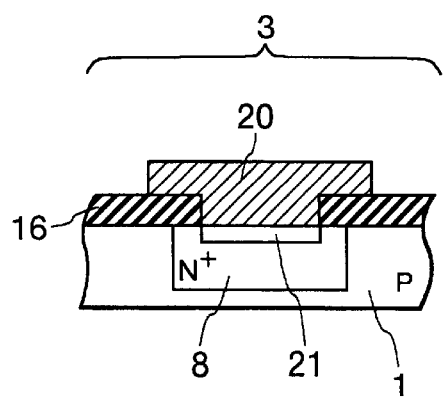
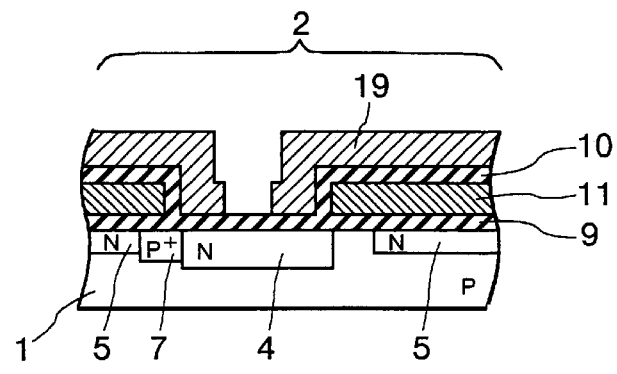
FIG. 7A  FIG. 7B

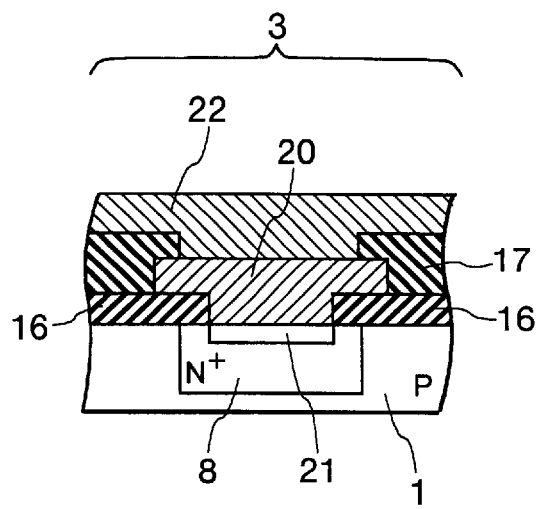
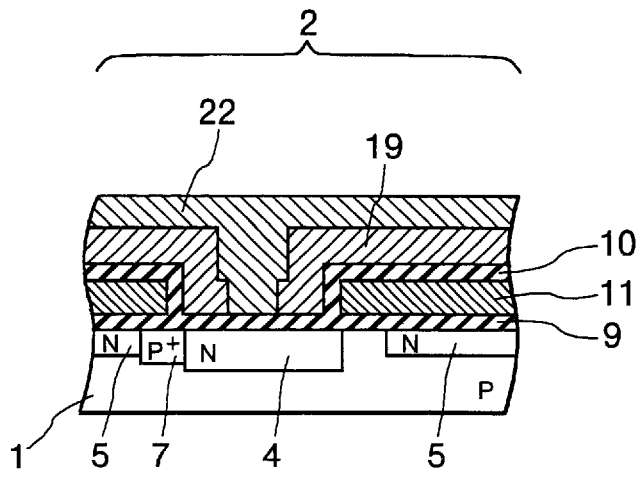
FIG. 8A    FIG. 8B
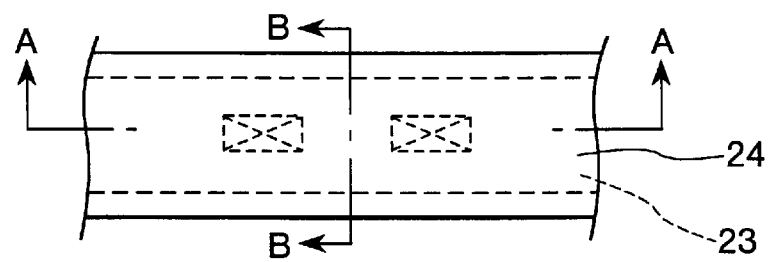
FIG. 9

SOLID-STATE IMAGE PICKUP DEVICE AND METHOD OF MANUFACTURING THE SAME

This application is based on Laid-open Japanese Patent Application No. 7-030088, which is incorporated herein by reference in its entirety.

BACKGROUND OF THE INVENTION

1. Field of the Invention

The present invention relates to a solid-state image pickup device comprising a CCD (Charge Coupled Device), more particularly to a solid-state image pickup device without smears and alloy spikes and a method of manufacturing the same.

2. Description of the Related Art

A CCD based solid-state image pickup device comprises an image pickup element unit and peripheral circuits. The image pickup element unit comprises sensors which convert incident light into signal charges and a charge transfer section which transfer the signal charges to other components. The sensors in the image pickup element unit are arranged in a matrix form. The peripheral circuits are arranged around the image pickup element unit. Both the image pickup elements and the peripheral circuits are formed on a common semiconductor substrate.

In the solid-state image pickup device, a photo shield must be provided so as to cover the image pickup element unit except the sensors in order to prevent smears caused by incident lights upon regions on the image pickup element unit other than the sensors.

The photo shield has the dual film structure including an aluminum film and an anti-reflection film. The aluminum film is used for wiring. The aluminum film has a large reflection rate and reflects light at its sides, ends and back surface. The anti-reflection film is prepared in order to allow the reflected lights from the aluminum film to enter at only the sensors.

However, it is difficult to prevent smears effectively by the anti-reflection film because the reflection rate of the aluminum film is large.

Alloy spiking may occur in the peripheral circuit of the solid-state image pickup device, or the like. Such alloy spiking is caused by direct connection between semiconductor layer and the aluminum wiring film. The semiconductor layer works as a source region and a drain region in a MOS transistor on the circuit. The alloy spikes may deteriorate the connection status between the semiconductor layer and the wiring film.

In a conventional method, a barrier metal layer is formed between the aluminum film and the semiconductor layer in order to avoid alloy spiking.

However, such method brings complication in manufacturing the solid-state image pickup device, because the step of forming the barrier metal layer is separated from the step of forming the anti-reflection film.

Laid-open Japanese patent application No. 7-030088 discloses a technique which avoids the above problem. According to the technique, the anti-reflection film and the barrier metal layer are formed in the same step. Also in this case, the aluminum film is used as the photo shield.

According to the technique more precisely, a titanium nitride film is formed on a semiconductor substrate, and a pure titanium film is deposited onto the titanium nitride film. Then, the substrate is subjected to heat treatment so that the pure titanium film is diffused into the titanium nitride film. The diffused titanium in the titanium nitride film reacts with silicon in a region where contacts are formed on the semiconductor substrate. The reaction causes formation of a titanium silicide layer. The titanium silicide layer is formed at a connection between a diffusion region of the MOS transistor and the titanium nitride layer.

A disadvantage of the above method is insufficiency of smear reduction even though the anti-reflection film is used. This is caused by using aluminum film having a large reflection rate in the photo shield. Moreover, the above method has extra steps for manufacturing the device. That is, a step for reacting titanium with silicon after diffusing pure titanium into the titanium nitride film is required to form the titanium silicide layer. Such titanium silicide layer is necessary because ohmic contact between the diffusion region in the peripheral circuit and the wiring is realized by the titanium nitride film and the titanium silicide layer. Furthermore, large contact resistance may appear.

SUMMARY OF THE INVENTION

The present invention has been made in consideration of the above. It is an object of the present invention to provide a solid-state image pickup device and a method of manufacturing the same which accomplish smear reduction.

It is another object of the present invention to provide a solid-state image pickup device and a method of manufacturing the same which realize excellent ohmic contact without alloy spiking in a simple way.

To accomplish the above objects, a solid-state image pickup device according to a first aspect of the present invention comprises:

an image pickup element unit, formed on a semiconductor substrate, comprising matrix formed sensors for converting incident light into charges and a photo shield for covering regions other than said sensors; and peripheral circuits arranged around said image pickup element unit formed on said semiconductor substrate comprising contacts made of a refractory metal film which is used in said photo shield.

According to this structure, since the solid-state image pickup device uses a refractory metal film (high melting point metal film) as a photo shield, it reduces smears more effectively than a solid-state image pickup device using an aluminum film as the photo shield.

Said photo shield and said contacts may be made of tungsten, or a laminated film comprising a titanium nitride film and a titanium film, and a tungsten film which is formed on said laminated film.

Said contacts and said semiconductor substrate may be connected to each other directly. A silicide layer of refractory metal may be formed between said contacts and said semiconductor substrate.

An aluminum film may be formed on said refractory metal layer of said contacts.

A wiring film comprising any one of a tungsten film, an aluminum film, or a laminated film of said tungsten film and said aluminum film is formed on regions other than said contacts.

A method of manufacturing a solid-state image pickup device according to a second aspect of the present invention comprises:

preparing a semiconductor substrate on which an image pickup element unit comprising sensors for converting incident light into charges, a charge transfer unit for transferring the charges from said sensors, and peripheral circuits arranged around said image pickup element unit;

forming a refractory metal film, on a whole surface of said semiconductor substrate after forming contact holes at predetermined positions on said peripheral circuits; and removing said refractory metal film on said sensors in said image pickup element unit and on regions other than contact holes in said peripheral circuits.

According to this structure, since the solid-state image pickup device uses a refractory metal film as a photo shield, it reduces smears more effectively than a solid-state image pickup device using an aluminum film as the photo shield.

Moreover, the manufacturing process is simplified because the photo shield and the contacts are formed in the same step.

A refractory metal film made of tungsten may be formed on the whole surface of said semiconductor substrate.

The method may comprise:

forming a wiring film comprising any one of a tungsten film, an aluminum film or a laminated film of said tungsten film and said aluminum film on regions other than said contacts, or forming a laminated film of a titanium nitride film and a titanium film on said prepared semiconductor substrate; and forming a tungsten film on said laminated film.

The method may further comprise:

transforming conjunction regions between said refractory metal film in said contact holes and said semiconductor substrate to silicide by heat treatment applied to said semiconductor substrate.

Said semiconductor substrate may be subjected to the heat treatment in an inactive atmosphere whose temperature is equal to or greater than 450 degrees Celsius and equal to or less than 600 degrees Celsius for 1 to 30 minutes to form the silicide.

The method may comprise:

forming an aluminum film at least on said contact holes in said peripheral circuits after the silicide is formed.

BRIEF DESCRIPTION OF THE DRAWINGS

FIGS. 2A and 2B are cross-sectional views showing a solid-state image pickup device according to a first embodiment of the present invention.

FIGS. 3A to 8B are process diagrams for explaining manufacturing steps of the solid-state image pickup device shown in FIGS. 2A and 2B.

FIG. 9 is a plan view showing a solid-state image pickup device according to a second embodiment of the present invention.

DETAILED DESCRIPTION OF THE PREFERRED EMBODIMENT

Embodiments of the present invention will now be described with reference to accompanying drawings.

First Embodiment

Figure 1:
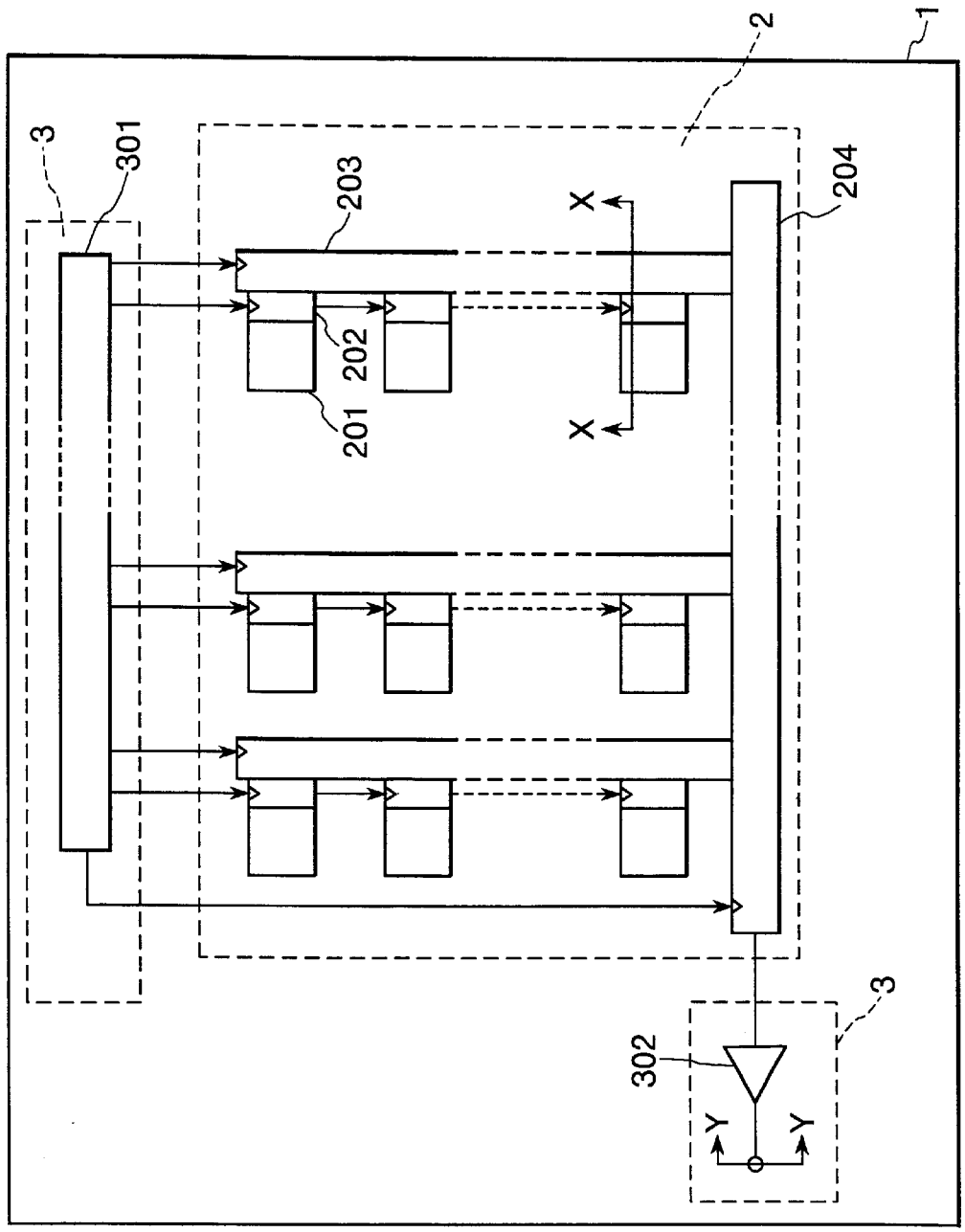
FIG. 1 is a diagram schematically showing the structure of a solid-state image pickup device according to a first embodiment of the present invention.

FIG. 1 is a plan view schematically showing the structure of a solid-state image pickup device according to a first embodiment of the present invention. As illustrated, the solid-state image pickup device comprises an image pickup element unit 2 and peripheral circuits 3. The image pickup element unit 2 is formed on a semiconductor substrate 1. The peripheral circuits 3 are disposed around the image pickup element unit 2.

The image pickup element unit 2 generates signal charges corresponding to incident lights and transfers the signal charges to an output circuit which will be described later. The image pickup element unit 2 comprises sensors 201, transfer gates 202, vertical charge transfer sections 203, and a horizontal charge transfer section 204.

Each of the sensors 201 is, for example, a photodiode. The sensors 201 are arranged on the semiconductor substrate 1 in a matrix form. The sensors 201 convert the incident light into signal charges whose charge amount corresponds to the luminance of the incident light. The signal charges are kept in the sensors 201.

Each of the transfer gates 202 is a MOS transistor and is coupled with each of the sensors 201. The transfer gates 202 transfer the signal charges kept in the sensors 201 to the vertical charge transfer sections 203 in accordance with a control signal from a timing control circuit 301 which will be described later.

The CCD (Charge Coupled Device) based vertical charge transfer sections 203 are arranged between the columns of the matrix sensors 201. Each of the vertical charge transfer sections 203 transfers the charges supplied from the sensors 201 via the transfer gates 202 in the vertical direction in accordance with a control pulse from the later-described timing control circuit 301.

The CCD (Charge Coupled Device) based horizontal charge transfer section 204 transfers the vertically transferred signal charges in the horizontal direction in accordance with a pulse signal from the later-described timing control circuit 301.

The timing control circuit 301 and the output circuit 302 which are arranged around the image pickup element unit 2 are the peripheral circuits 3.

The timing control circuit 301 controls the transfer gates 202, the vertical charge transfer sections 203 and the horizontal charge transfer section 204. The output circuit 302 converts the signal charges transferred from the horizontal charge transfer section 204 into voltage signals. The voltage signals are output from an output contact (output pat) P as a video signal.

The connection between the image pickup element unit 2 and the peripheral circuits 3 will now be described in detail with reference to FIGS. 2A and 2B.

FIG. 2A is a cross-sectional view along a line Y—Y shown in FIG. 1 showing the structure of the output pat P in the output circuit 302 of the peripheral circuits 3. FIG. 2B is a cross-sectional view along a line X—X showing the structure of a pixel of the image pickup element unit 2.

As shown in FIGS. 2A and 2B, the peripheral circuits 3 including the output pat P and the image pickup element unit 2 are formed on the p-type semiconductor substrate 1 which is made of single crystal silicon.

As shown in FIG. 2B, N-type regions 4 are formed in the semiconductor substrate 1 so as to correspond to the sensors 201 above. The N-type regions 4 are prepared for optoelectronic conversion. Each of N-type regions 5 in the semiconductor substrate 1 is an elemental component of each vertical charge transfer section 203. The charges transfer through the N-type regions 5. Each N-type region 5 shown in FIG. 2B is elongated in the vertical direction to the drawing sheet. P+ regions 7 are formed among the pixels. In FIG. 2B, the P+ region 7 is prepared between the adjacent pixels 14 and 15. The P+ regions 7 work as channel stoppers which electrically isolate pixels from each other.

As shown in FIG. 2A, in the peripheral circuits 3 having the output pat P, an N+ region 8 is formed in the silicon substrate 1. The video signal from the output circuit 302 is supplied to an outer device through the N+ region 8 and a later-described contact.

As shown in FIG. 2B, a gate insulating film 9 made of a silicon oxide film and an interlayer insulating film 10 are formed on the semiconductor substrate 1. Transfer electrodes 11 are formed between the gate insulating film 9 and the interlayer insulating film 10. The transfer electrodes 11 are formed so as to correspond to the N+ regions 5 in the semiconductor substrate 1. The charges from the N+ regions 5 transfer through the transfer electrodes 11. Each of the transfer electrodes 11 is made of amorphous silicon or the like, and is elongated in the vertical direction to the drawing sheet of FIG. 2B.

The P-type semiconductor substrate 1 and the N-type region 4 therein act as each sensor 201 shown in FIG. 1. And each of the transfer gates 202 shown in FIG. 1 comprises the N-type region 4, the N-type region 5, the insulating film 9 on the N-type region 5 and the transfer electrode 11. Each of the vertical charge transfer sections 203 shown in FIG. 1 comprises the N-type region 5, the insulating film 9 on the N-type region 5 and the transfer electrode 11. In FIG. 2B, the vertical charge transfer section 203 is elongated in the vertical direction to the drawing sheet.

A tungsten film 19 is formed on the interlayer insulating film 10 so as to cover the whole surface except the sensors 201. The tungsten film 19 whose thickness is 300 nm to 400 nm works as the photo shield which allows the incident lights to enter at only the sensors 201. A refractory metal (high melting point metal) film such as the tungsten film 19 has a smaller reflection rate than the aluminum film. Moreover, the reflection rate of the tungsten film is relatively smaller than that of any other refractory metal films. Therefore, light reflected at the sides and a back surface of the photo shield is reduced, thus, it effectively reduces incidence rate of lights upon the regions other than the sensors 201. As a result, smears caused by the incident light upon the regions other than the sensors 201 are reduced effectively.

In the region where the output pat P is formed, an insulating film 16 is formed on the semiconductor substrate 1 as shown in FIG. 2A. The insulating film 16 is made of a silicon oxide film or the like. A contact hole 18 is formed in the insulating film so as to be just above the N+ region 8 in the semiconductor substrate 1. A tungsten film 20 is partially formed on the insulating film 16 so as to fill the contact hole 18. The tungsten film 20 having the thickness of 300 nm to 400 nm works as a barrier metal film for preventing the alloy spiking. An interlayer insulating film 17 made of a silicon oxide film, silicon nitride film, or the like is formed on regions on the insulating film 16 other than the regions where the tungsten film 20 is formed.

A tungsten silicide layer 21 is formed between the N+ region 8 and the tungsten film 20.

An aluminum film 22 is formed on the tungsten film 20. The aluminum film 22 whose thickness is 400 nm to 500 nm works as wiring. The aluminum film 22 is connected to the N+ region 8 via the tungsten film 20 and the tungsten silicide layer 21. That is, the contact hole 18 of the peripheral circuits 3 consists of the tungsten silicide layer 21, the tungsten film 20 and the aluminum film 22, and this structure brings excellent ohmic contact characteristics to the contact.

Manufacturing steps of the solid-state image pickup device will now be described with reference to FIGS. 3A to 8B.

The P-type semiconductor substrate 1 on which the image pickup element unit 2 and the peripheral circuits 3 are formed as shown in FIGS. 3A and 3B is prepared. The semiconductor substrate 1 has the N-type regions 4 and 5, and the N+ region 8. Those regions are formed by ion implantation of N-type impurities such as phosphorous into the semiconductor substrate 1. The semiconductor substrate 1 also has the P+ region 7 which is formed by implanting P-type impurities such as boron. Then, the gate insulating film 9, the interlayer insulating film 10, the transfer electrode 11, the insulating film 16, and the like are deposited onto the semiconductor substrate 1 by CVD or sputtering.

As shown in FIGS. 4A and 4B, the contact hole 18 is formed in the insulating film 16 of the peripheral circuits 3 by the photolithographic method. The contact hole 18 is prepared to electrically contact the N+ region 8 and the later described aluminum wiring layer. Then, a tungsten film 35 is deposited by the sputtering onto the whole surface of the substrate 1 as shown in FIGS. 5A and 5B so as to have the thickness of 300 nm to 400 nm.

The semiconductor substrate 1 is subjected to heat treatment in an inactive atmosphere of nitrogen for about 30 minutes. A temperature for the heat treatment is equal to or less than approximately 600 degrees Celsius. FIGS. 6A and 6B show the semiconductor substrate 1 after the heat treatment. As illustrated, the tungsten silicide layer 21 formed on the N+ region 8 after the tungsten film 35 fills the contact hole 18 reacts with the N+ region 8.

Since there are the gate insulating film 9 and the interlayer insulating film 10 beneath the tungsten film 35 in the image pickup element unit 2, the tungsten silicide layer is not formed in the image pickup element unit 2. It is preferable that the above described heat treatment is carried out under a temperature equal to or greater than approximately 450 degrees Celsius for approximately 1 minute or longer. Note that the step of forming the silicide layer may be omitted.

As shown in FIGS. 7A and 7B, the tungsten film 35 is patterned by a photolithographic method. As a result of the patterning, openings corresponding to the sensors 201 are formed in the tungsten film 35 of the image pickup element unit 2, and the tungsten film 35 remains only on the contacts in the peripheral circuits 3.

Thus, the image pickup element unit 2 has the tungsten film 19 which works as a photo shield for preventing smears, and the peripheral circuits 3 have the tungsten film 20 which works as a barrier metal film for preventing alloy spiking.

As shown in FIGS. 8A and 8B, the aluminum film 22 is formed on the whole surface of the semiconductor substrate 1 after forming an interlayer insulating film 17. The aluminum film 22 is formed by sputtering, vacuum evaporation, or the like so as to have a thickness of 400 nm to 500 nm. The aluminum film 22 of the peripheral circuits 3 is patterned by the photolithographic method so that the aluminum film 22 remains only on the contacts, thus the wiring of the aluminum film 22 is formed on the contacts. Thus, the solid-state image pickup device shown in FIG. 1 is completed.

Accordingly in the manufactured solid-state image pickup device in the above first embodiment, the photo shield comprises the tungsten film. Since the refractory metal such as tungsten has a smaller reflection rate than aluminum, the solid-state image pickup device according to the first embodiment more effectively reduces smears than the conventional solid-state image pickup device using an aluminum photo shield.

According to the above described method of manufacturing the solid-state image pickup device, the semiconductor substrate is subjected to heat treatment. Since the tungsten film 19 is formed in the peripheral circuits, the heat treatment causes reaction between the tungsten film 19 formed on the semiconductor substrate and silicon of the semiconductor substrate. As a result, the tungsten silicide 21 is formed. The tungsten film 19 and the tungsten silicide 21 cause ohmic contact between the N+ region 8 and the wiring. Accordingly, the method according to the first embodiment realizes excellent ohmic contact without alloy spiking. Moreover, it is easier than the method of manufacturing a solid-state image pickup device disclosed in Laid-open Japanese patent application No. 7-030088 which realizes ohmic contact between a diffusion region in peripheral circuits and wiring. In such a conventional technique, a semiconductor substrate having a titanium nitride film in which pure titanium is diffused is subjected to heat treatment. And the heat treatment causes reaction between titanium and silicon in the semiconductor substrate, thus, a titanium silicide layer is formed. The titanium nitride film and the titanium silicide layer form the ohmic contact.

Second Embodiment

Figure 10:
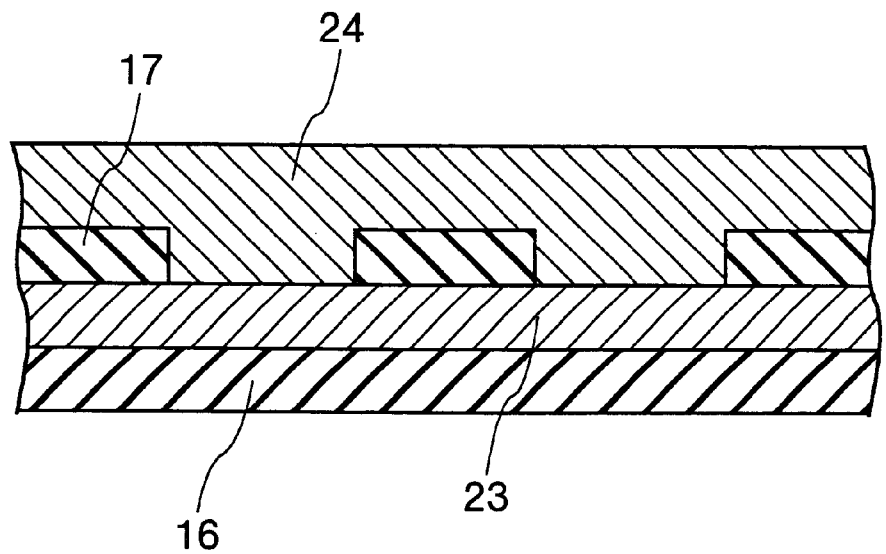
FIG. 10 is a cross-sectional view showing the solid-state image pickup device along a line A—A shown in FIG. 9.

FIG. 9 is a plan view showing the structure of a solid-state image pickup device according to a second embodiment. FIG. 10 is a cross-sectional view along a line A—A in FIG. 9, and FIG. 11 is a cross-sectional view along a line B—B in FIG. 9.

In a solid-state image pickup device according to the second embodiment, the tungsten film 19 works as both a barrier metal film and wiring while the tungsten film 19 in the first embodiment works as only the barrier metal in the peripheral circuits 3.

Figure 11:
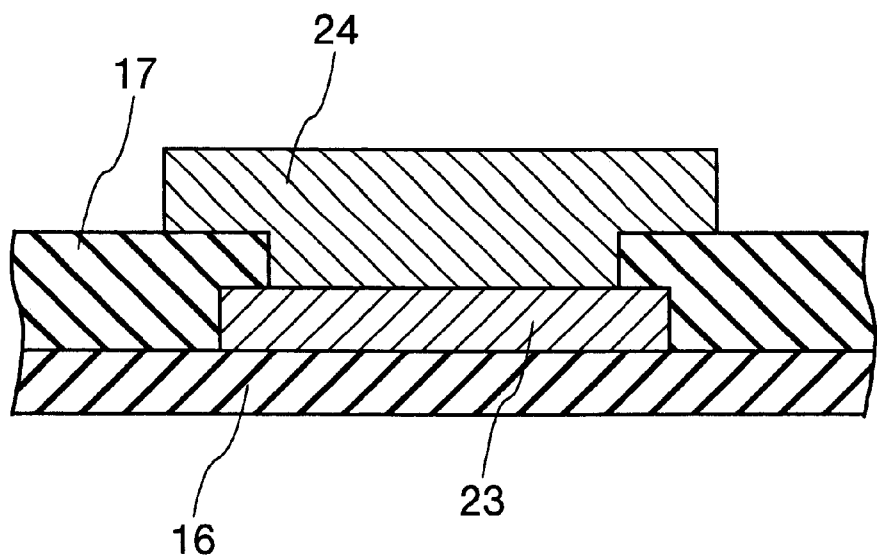
FIG. 11 is a cross-sectional view showing the solid-state image pickup device along a line B—B shown in FIG. 9.

As shown in FIGS. 9 to 11, a first layer wiring film including the tungsten film 23 is formed on the insulating film 16. The tungsten film 23 and the tungsten film 19 (which is the same as that described in the first embodiment) are formed simultaneously. And, a second layer wiring film of the aluminum film 24 (which is the same as that described in the first embodiment) is formed on the first layer wiring film. Note that the first layer wiring film and the second layer wiring film have the same pattern in this embodiment.

In the same manner as the first embodiment, the solid-state image pickup device according to this embodiment uses the tungsten film as the photo shield. Since a refractory metal film such as the tungsten film has a smaller reflection rate than the aluminum film, the solid-state image pickup device according to this embodiment reduces smears more effectively than the conventional solid-state image pickup device using the aluminum film as the photo shield.

According to the above method of manufacturing the solid-state image pickup device, excellent ohmic contact is realized without alloy spiking by an easier way than the conventional technique.

Moreover, since the wiring comprises the first layer wiring of the tungsten film 23 and the second layer wiring of the aluminum film 24, the wiring has smaller resistance and higher reliability.

Third Embodiment

Figure 12:
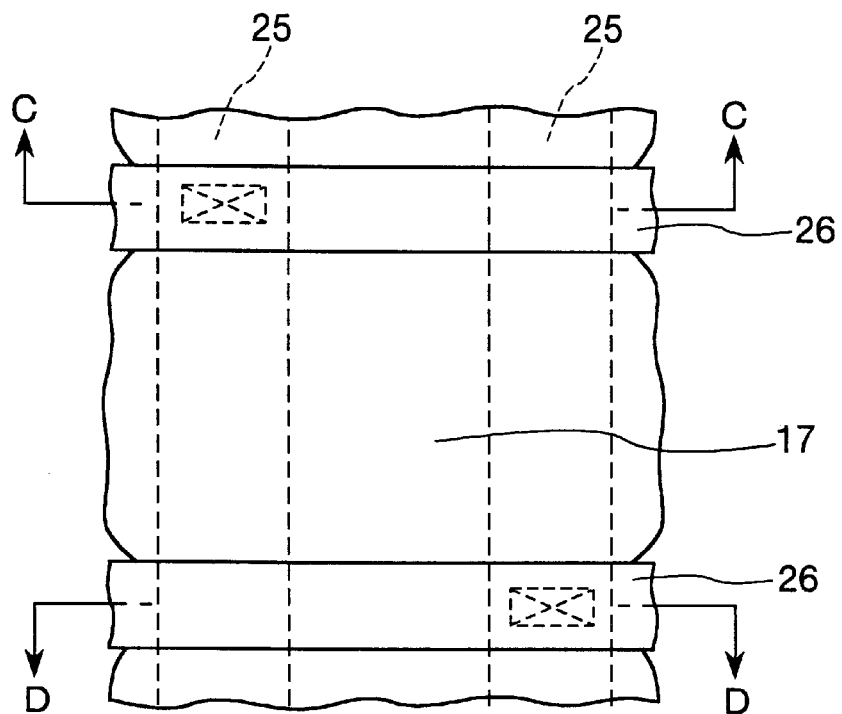
FIG. 12 is a plan view showing a solid-state image pickup device according to a third embodiment of the present invention.
Figure 13:
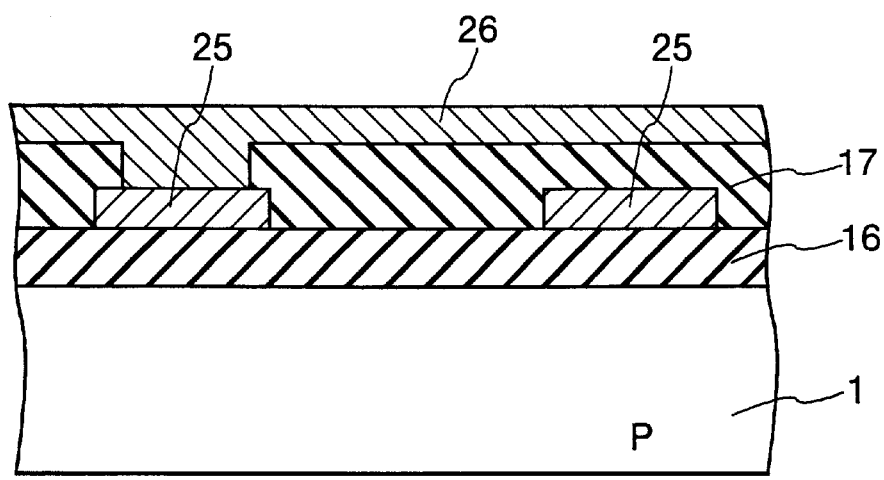
FIG. 13 is a cross-sectional view showing the solid-state image pickup device along a line C—C shown in FIG. 12.

FIG. 12 is a plan view showing the structure of a solid-state image pickup device according to a third embodiment of the present invention. FIG. 13 is a cross-sectional view along a line C—C in FIG. 12, and FIG. 14 is a cross-sectional view along a line D—D in FIG. 12.

In the solid-state image pickup device according to this embodiment, the first layer wiring of the tungsten film 25 and the second layer wiring of the aluminum film 26 have different patterns while the first layer wiring and the second layer wiring have the same patterns in the second embodiment.

Figure 14:
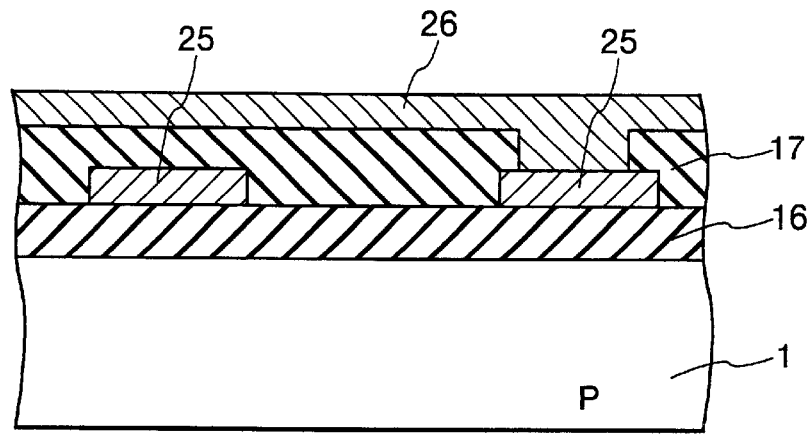
FIG. 14 is a cross-sectional view showing the solid-state image pickup device along a line D—D shown in FIG. 12.

As shown in FIGS. 12 to 14, a first layer wiring comprising a pair of rectangular-shaped tungsten films 25 is formed on the insulating film 16, and a second layer wiring 26 comprising a pair of rectangular-shaped aluminum films 26 whose width is narrower than that of each tungsten film 25 formed on the first layer wiring. The first layer wiring and the second layer wiring cross each other at right angles.

In the same manner as the first and second embodiments, the solid-state image pickup device according to the third embodiment uses the tungsten film as the photo shield. Since a refractory metal film such as the tungsten film has a smaller reflection rate than the aluminum film, the solid-state image pickup device according to this embodiment reduces smears more effectively than the conventional solid-state image pickup device using the aluminum film as the photo shield.

According to the above method of manufacturing the solid-state image pickup device, excellent ohmic contact is realized without alloy spiking by an easier way than the conventional technique.

Moreover, since the tungsten film and the aluminum film have a different pattern in the solid-state image pickup device according to this embodiment, flexible patterned wiring is available.

Fourth Embodiment

Figures 15A, 15B:
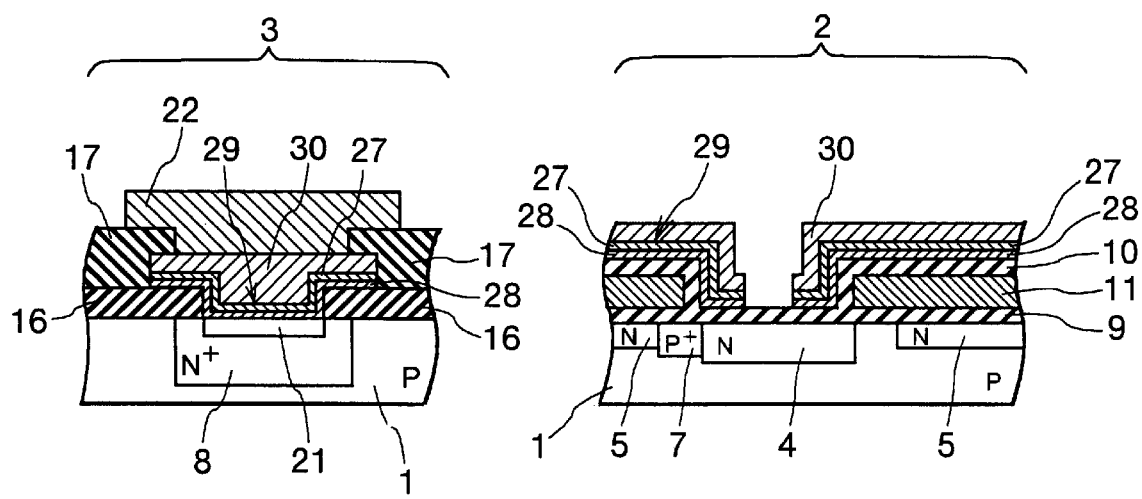
FIGS. 15A and 15B are cross-sectional views showing a solid-state image pickup device according to a fourth embodiment of the present invention.

FIGS. 15A and 15B are cross-sectional views showing the structure of a solid-state image pickup device according to a fourth embodiment.

In the solid-state image pickup device according to this embodiment, the structure of the refractory metal film differs from that in the first embodiment. That is, the metal film according to this embodiment to be used as the photo shield in the image pickup element unit 2 and the barrier metal layer in the peripheral circuits 3 comprises a laminated film comprising a titanium nitride film and a titanium film, and a tungsten film.

As illustrated, both the photo shield in the image pickup element unit 2 and the barrier metal film in the peripheral circuits 3 have a laminated film 29 comprising a titanium nitride film 27 having the thickness of approximately 50 nm and a titanium film 28 having the thickness of approximately 50 nm, and a tungsten film 30 having the thickness of 300 nm to 400 nm formed on the laminated film 29.

In the image pickup element unit 2 and the peripheral circuits 3, the titanium film 28 and the titanium nitride film 27 are formed on the insulating film 16 having the contact hole 18 by sputtering or the like, thus the laminated film 29 is formed.

The solid-state image pickup device according to this embodiment uses a photo shield comprising a laminated film consisting of the films of titanium nitride and titanium and the tungsten film. Since the photo shield has such structure, the solid-state image pickup device according to this embodiment reduces smears more effectively than the solid-state image pickup devices described in the first to third embodiments which use the photo shield comprising only the tungsten film.

Moreover, since the contact between the N-type region 8 and the wiring in the peripheral circuits comprises the tungsten film 30 and the laminated film 29 of the titanium nitride film 27 and the titanium film 28, the solid-state image pickup device according to this embodiment has smaller contact resistance than the solid-state image pickup devices described in the first to third embodiments in which the contact comprises only the tungsten film 19.

The present invention is not limited to the above first to fourth embodiments, but may be modified as needed. For example, the material of the insulating film or the interlayer insulating film is not limited to silicon oxide or silicon nitride. Another material such as BSG (Boro Silicate Glass), PSG (Phospho Silicate Glass) or BPSG (Boro-Phospho Silicate Glass) may be used for the insulating film.

The above described conditions for the thickness of the metal layers or heat treatment for the substrate are examples, therefore, those may be changed as needed.

In a case where the wiring comprising the tungsten film and the aluminum film is used in the peripheral circuits, some parts of the wiring may comprise only the tungsten film or the aluminum film.

The refractory metal film is not limited to the tungsten film and the laminated film of the titanium nitride film and titanium film. Another material such as molybdenum or only titanium may be used for the metal layer.

The arrangement of the P-type regions and the N-type regions of each semiconductor regions in the image pickup device may be inverted.

What is claimed is:

1. A solid-state image pickup device comprising:
   an image pickup element unit, formed on a semiconductor substrate comprising sensors, formed in matrix, for converting incident light into charges and a photo shield for covering regions other than said sensors; and
   peripheral circuits arranged around said image pickup element unit formed on said semiconductor substrate comprising contacts made of a refractory metal film, said metal film also being used in said photo shield, wherein said metal film comprises a laminated film comprising a titanium nitride film and a titanium film, and a tungsten film being formed on said laminated film.

2. The solid-state image pickup device according to claim 1, wherein said contacts and said semiconductor substrate are connected to each other directly.

3. The solid-state image pickup device according to claim 1, wherein a silicide layer of refractory metal is formed between said contacts and said semiconductor substrate.

4. The solid-state image pickup device according to claim 1, wherein an aluminum film is formed on said refractory metal layer of said contacts.

5. The solid-state image pickup device according to claim 1, wherein a wiring film comprising any one of a tungsten film, an aluminum film, or a laminated film of said tungsten film and said aluminum film is formed on regions other than said contacts.

6. A solid-state image pickup device comprising:
   an image pickup element unit in which areas other than sensors which convert incident light into charges, are covered by a photo shield made of a refractory metal film;
   peripheral circuits arranged around said image pickup element unit, contacts made of refractory metal films being formed in said peripheral circuits;
   first wiring lines made of a refractory metal film, being formed on an insulation film and connected to said contacts; and
   a pair of linear patterned second wiring lines made of a metal film, being formed on an interlayer insulation film on said first wiring lines so that said pair of linear patterned second wiring lines are crossing said first wiring lines.

7. The solid-state image pickup device according to claim 6, wherein said photo shield and said contacts are made of tungsten.

8. The solid-state image pickup device according to claim 6, wherein said refractory metal film comprises a laminated film comprising a titanium nitride film and a titanium film, and a tungsten film which is formed on said laminated film.

9. The solid-state image pickup device according to claim 6, wherein said contacts and said semiconductor substrate are connected to each other directly.

10. The solid-state image pickup device according to claim 6, wherein a silicide layer of refractory metal is formed between said contacts and said semiconductor substrate.

11. The solid-state image pickup device according to claim 6, wherein an aluminum film is formed on said refractory metal layer of said contacts.

12. The solid-state image pickup device according to claim 6, wherein a wiring film comprising any one of a tungsten film, an aluminum film, or a laminated film of said tungsten film and said aluminum film is formed on regions other than said contacts.

* * * * *